United States Patent [19]

Garskamp

[11] 4,253,195
[45] Feb. 24, 1981

[54] FM-RECEIVER COMPRISING A SEARCH TUNING SYSTEM

[75] Inventor: Arnoldus Garskamp, Eindhoven, Netherlands

[73] Assignee: U.S. Philips Corporation, New York, N.Y.

[21] Appl. No.: 86,921

[22] Filed: Oct. 22, 1979

[30] Foreign Application Priority Data

Nov. 1, 1978 [NL] Netherlands .................. 7810859

[51] Int. Cl.³ ............................................. H03J 7/18
[52] U.S. Cl. ..................................... 455/166; 455/169
[58] Field of Search ................................ 455/161–169

[56] References Cited

U.S. PATENT DOCUMENTS

| | | | |
|---|---|---|---|
| 2,652,486 | 9/1953 | Guyton | 455/169 |
| 2,764,675 | 9/1956 | Guyton | 455/169 |
| 2,915,625 | 12/1959 | Worcester | 455/200 |
| 3,020,405 | 2/1962 | Schwarz | 455/162 |
| 3,568,065 | 3/1971 | Pagany et al. | 455/169 |
| 3,665,319 | 5/1972 | Worcester | 455/169 |

Primary Examiner—Marc E. Bookbinder
Attorney, Agent, or Firm—Thomas A. Briody; William J. Streeter; Edward W. Goodman

[57] ABSTRACT

FM-receiver comprising a search tuning arrangement, a control device for making the search tuning arrangement operative, a frequency discriminator and a stop-pulse generator having a threshold and being connected to an output of the frequency discriminator and supplying, when its threshold voltage is passed by the output voltage of the frequency discriminator, a stop-pulse for rendering the search tuning arrangement inoperative, the demodulation sensitivity of the frequency discriminator being brought from a maximum to a minimum level in order to prevent false stop-pulses from being generated in response to the fact the threshold voltage is exceeded by detected audio signals and said detection sensitivity being brought from the minimum to the maximum level when the search tuning arrangement is made operative, in order to enable tuning to weak and-/or adjacent transmitters during the search tuning process.

3 Claims, 7 Drawing Figures

FM-RECEIVER COMPRISING A SEARCH TUNING SYSTEM

The invention relates to a FM-receiver comprising a search tuning system, a control device for making the search tuning system operative, a frequency discriminator and a stop-pulse generator having a threshold and being connected to an output of the frequency discriminator and supplying a stop-pulse when the output voltage of the frequency discriminator passes its threshold voltage, for making the search tuning system inoperative.

Such a FM-receiver is described in "Philips Electronic Components and Materials", Application Information 144, "FM Search tuning system using TCA 750", dated Nov. 7th, 1974, by A. Garskamp.

On receipt of weak transmitter signals it may happen that the output voltage of the frequency discriminator of the known FM-receiver is below the threshold voltage of the stop-pulse generator which, consequently, does not produce stop-pulses so that an automatic tuning by means of the search tuning system of this FM-receiver at the carrier frequency of such weak transmission signals is not possible.

Transmitters which transmit with a sufficient strength to be recognized as such by the stop-pulse generator but whose frequency is near the frequency of a much stronger transmitter may be skipped when the search tuning system of the known FM-receiver is activated from the transmission frequency of the stronger transmitter. A similar result may occur if two transmitters of substantially the same strength are very near to one another in frequency, one of the two transmitters is skipped after activation of the search tuning system from tuning to the other transmitter.

It is an object of the invention to mitigate these drawbacks.

According to the invention, a FM-receiver of the type defined in the preamble is characterized in that the FM-receiver also comprises a control circuit connected to the frequency discriminator and the stop-pulse generator for increasing the ratio between the output voltage of the frequency discriminator and the threshold voltage of the stop-pulse generator on activation of the search tuning system and for reducing this ratio when the search tuning system is made inoperative.

When the measure according to the invention is applied the sensitivity of the stop-pulse generator is increased during the searching action of the search tuning system. This enables an automatic tuning to weak transmitters and closely adjacent transmitters, independent of the direction of search. When the search tuning system is rendered inoperative by a stop-pulse of the stop-pulse generator and the FM-receiver has been tuned to a transmitter it may happen in the known FM-receiver that signals of audio frequency exceed the threshold voltage of the stop-pulse generator, thus producing stop-pulses. When these unwanted stop-pulses are frequently produced, they may eliminate activation of the search tuning system by means of the control device so that a further continuation of the search action is prevented and the FM-receiver remains tuned to the same transmitter. The measure according to the invention prevents this by reducing the ratio between the output voltage of the frequency discriminator and the threshold voltage of the stop-pulse generator on deactivation of the search tuning system, that is to say at the occurrence of a stop-pulse. This renders the stop-pulse generator insensitive to large signals of audio frequency, so that unwanted stop-pulses cannot be produced during the tuning operation.

This measure according to the invention can, for example, be realised by keeping the threshold voltage of the stop-pulse generator at the same, constant value and by reducing the steepness of the S-curve of the frequency discriminator at the occurrence of a stop-pulse and by increasing this steepness on activation of the search tuning system. Alternatively, the measure can be realized by keeping the steepness of the S-curve of the frequency discriminator constant and by increasing the threshold voltage of the stop-pulse generator at the occurrence of a stop-pulse and to reduce it at activation of the search tuning system.

A preferred embodiment of a FM-receiver according to the invention, wherein the first-mentioned mode of realisation is used and wherein the frequency discriminator comprises a resonant circuit, is characterized in that the control circuit comprises a switchable circuit element, included in the resonant circuit, for increasing the circuit quality of the resonant circuit during the active period and for reducing said circuit quality during the inactive period of the search tuning system.

After activation of the search tuning system the use of this measure provides a simple method of increasing the circuit quality of the resonant circuit and, consequently, the steepness of the S-curve of the frequency discriminator and of reducing the circuit quality after the occurrence of a stop-pulse.

A further preferred embodiment of a FM-receiver according to the invention is characterized in that the switchable circuit element of the control circuit is a resistor which is switchable in parallel across the resonant circuit.

The invention will be further explained by way of non-limitative example with reference to the Figures shown in the drawing.

Herein:

Figure 1A:
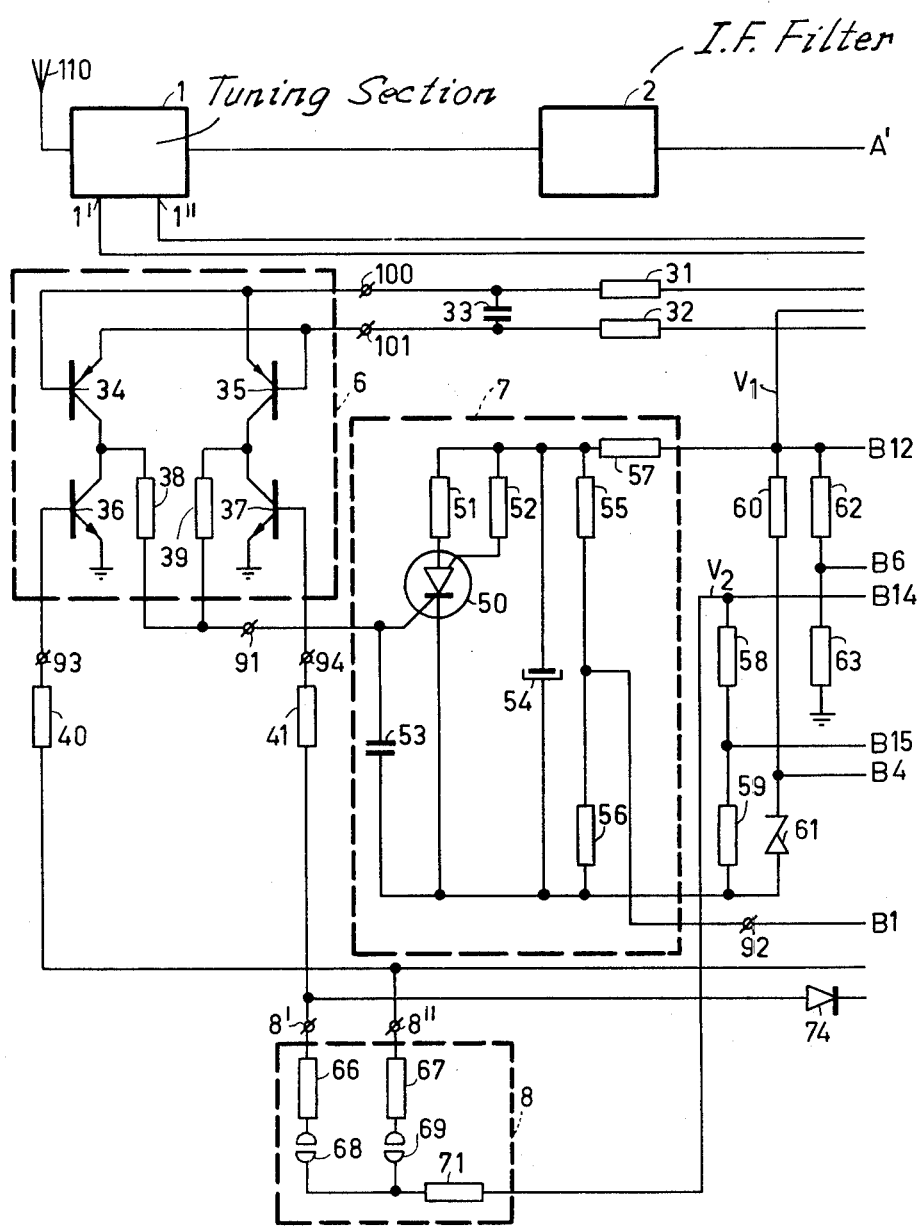
FIG. 1a and FIG. 1b show a FM-receiver comprising a search tuning system according to the invention.
Figure 1B:
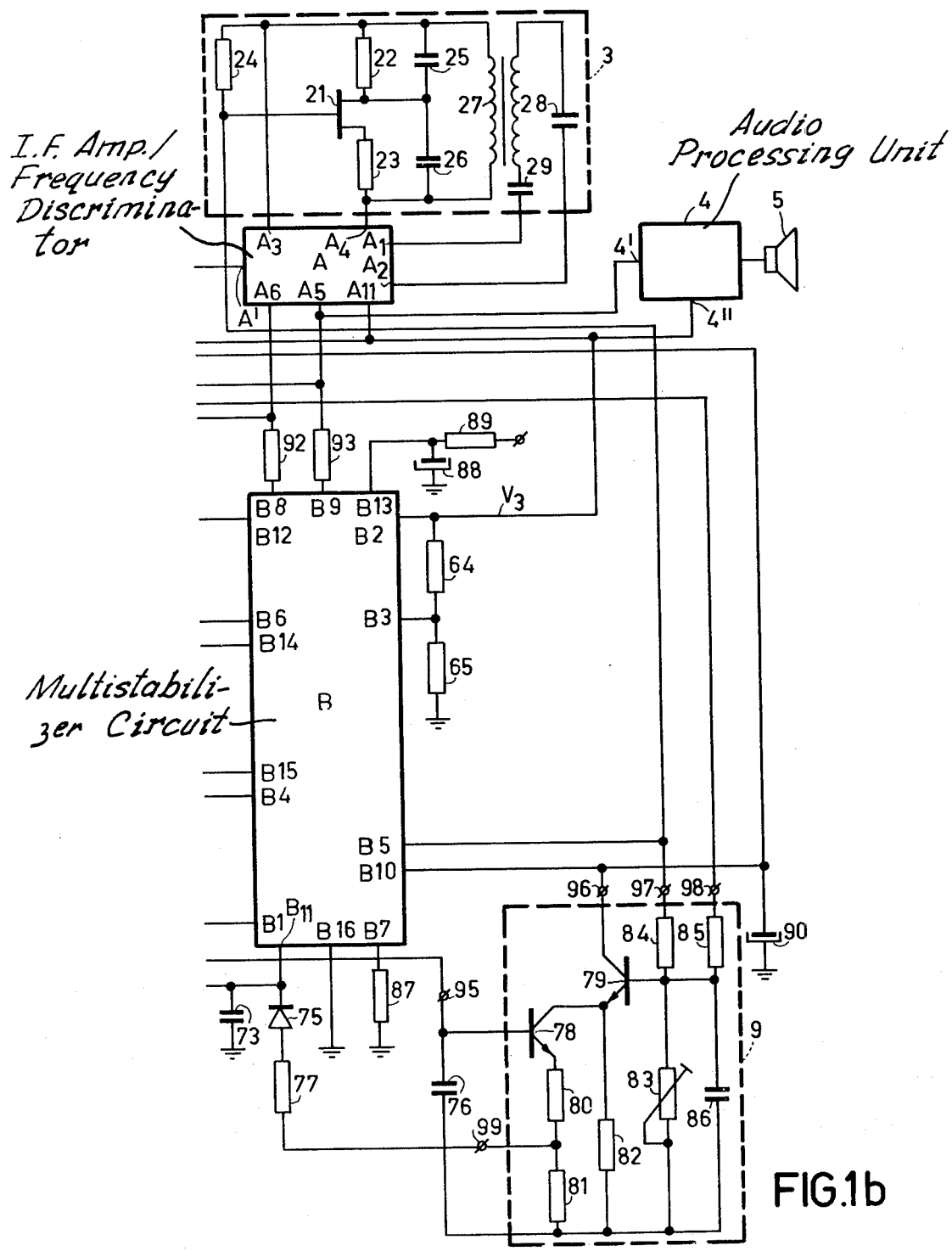

FIG. 1a and FIG. 1b show a FM-receiver comprising a tuning section 1, coupled to an aerial 110 and provided with a variable capacitance diode, not shown, to which a tuning voltage is applied via a tuning input 1', also comprising, consecutively arranged in cascade with the tuning section 1, an intermediate frequency filter 2, an integrated circuit A of the type TCA 420 A having an external, controllable, tuned circuit 3, the integrated circuit A including an intermediate frequency amplifier and a quadrature demodulator, connected to the circuit 3 and operating as a frequency discriminator, an audio processing unit 4 and a loudspeaker 5. By means of the above-mentioned devices a desired aerial signal is converted in known manner into a sound signal.

The integrated circuit A is described in "Philips Electronic Components and Materials" Application note 209, entitled "TCA 420 A - Hifi FM/IF Amplifier Integrated Circuit", dated February 1974. Knowledge of the exact operation of this integrated circuit A is not necessary for an understanding of the invention. A detailed description of this integrated circuit is therefore omitted.

The integrated circuit A comprises an input A' for the connection to the IF-filter 2, terminals $A_1$ to $A_4$ inclusive for connection to the external tuned circuit 3, output terminals $A_5$ and $A_6$ for the supply of an audio or stereo multiplex signal and a supply terminal $A_{11}$. The output terminal $A_5$ is coupled to an input 4' of the audio processing unit 4. The reference numerals denoting the terminals of the integrated circuit A correspond to the reference numerals used for the terminals in the last-mentioned publication.

The output terminals $A_5$ and $A_6$ of the integrated circuit A are connected, for automatic frequency control, to input terminals $B_9$ and $B_8$ of an integrated circuit B via resistors 93 and 92, respectively, and connected to inputs 100 and 101 of a stop-pulse generator 6 via a low-pass filter 31, 32, 33.

The integrated circuit B is of the type TCA 750 and is described in "Philips Product Information 60", "Multi-stabilizer TCA 750 and reference diode BZV 38", by A. Garskamp, dated Mar. 18th, 1974. Reference is made to this publication for detailed information. The following description mentions only those functions of this integrated circuit B which are of importance for understanding the invention.

In addition to the terminals $B_8$ and $B_9$ already mentioned above, the integrated circuit B also comprises terminals $B_1$ to $B_7$, inclusive, and $B_{10}$ to $B_{16}$, inclusive, the reference numerals denoting the terminals corresponding to the rererence numerals used for the terminals in the last-mentioned publication. The terminal $B_{10}$ supplies a controllable current consisting of a constant current $I_O$, whose value is determined by a grounded resistor 87 connected to the terminal $B_7$, and an automatic frequency control current $I_{afc}$ derived from the automatic frequency control voltage $V_{afc}$ at the terminals $B_8$ and $B_9$. In addition, the terminal $B_{10}$ is connected to ground via a tuning capacitor 90 and is coupled to the tuning input 1' of the tuning unit 1. The automatic frequency control current $I_{afc}$ can be switched off by means of a control current at the terminal $B_{11}$. Furthermore the integrated circuit B produces stabilized voltages $V_1$, $V_2$ and $V_3$, measured with respect to the grounded terminal $B_{16}$. These stabilized voltages are obtained from an unstabilized supply voltage applied to the terminal $B_{13}$ via a smoothing filter 88, 89. For the purpose of stabilisation use is made of a zener diode 61, which is arranged between ground and the terminal $B_4$, and arranged in series with a resistor 60 coupled to the terminal $B_{12}$, to which terminal $B_{12}$ the stabilized voltage $V_1$ is supplied, the value of which is adjusted by feeding back a portion of the voltage $V_1$ to the terminal $B_6$ via a voltage divider 62, 63 connected between the terminal $B_{12}$ and ground, the junction of the resistors 62 and 63 being connected to the terminal $B_6$. The stabilized switchable voltage $V_2$ is applied to the terminal $B_{14}$. The value thereof is adjusted by means of a voltage at the terminal $B_{15}$, this voltage being derived from the voltage $V_2$ by means of a voltage divider 58, 59 connected between the terminal $B_{14}$ and ground, the junction of the resistors 58 and 59 being connected to the terminal $B_{15}$. The stabilized voltage $V_2$ is switched by means of a voltage at the terminal $B_1$.

The stabilized voltage $V_3$ is supplied at terminal $B_2$ for feeding the tuning section 1 via a supply terminal 1", the integrated circuit A via the terminal $A_{11}$ and the audio signal processing section 4 via supply input 4". The value of the voltage $V_3$ is adjusted by means of a voltage at the terminal $B_3$ which is derived from the voltage $V_3$ by means of a voltage divider 64, 65 arranged between the terminal $B_2$ and ground, the junction between the resistors 64 and 65 being connected to the terminal $B_3$. A constant current which is switchable by means of a control current at the terminal $B_{11}$ is supplied at terminal $B_5$. The terminal $B_5$ is connected to the controllable tuned circuit 3 for the control thereof.

The stop-pulse generator 6 has its output 91 coupled to a control signal generating device 7, which is connected to the terminal $B_1$ of the integrated circuit B by means of an output 92. The stop-pulse generator 6 is also coupled to outputs 8' and 8" of a tuning control panel 8 via inputs 93 and 94 and resistors 40 and 41, respectively. The output 8' of this tuning control panel 8 is coupled to the terminal $B_{11}$ via a diode 74 and the output 8" to an input 95 of a controllable current source 9. The tuning control panel 8 is supplied with the switchable voltage $V_2$ for which purpose it is connected to the terminal $B_{14}$. The controllable current source 9 is coupled to the terminal $B_{11}$ via an output 99 and a series arrangement of a resistor 77 and a diode 75, to the terminal $B_{10}$ via an output 96, to the terminal $B_5$ via a first supply input 97 and to the terminal $B_{12}$ via a second supply input 98.

The terminal $B_{11}$ is connected to ground via a short-circuiting capacitor 73, the input 95 of the controllable current source 9 is likewise connected to ground via a short circuiting capacitor 76.

The FM-receiver outlined above with the exception of the tuned circuit 3 is described in detail, in the above-mentioned "Philips Electronic components and Materials" Application Information 144, entitled "FM Search Tuning System using TCA 750" by A. Garskamp, dated Nov. 7th, 1974. The following description mentions only the switching data which are of importance for understanding and applying the invention.

The stop-pulse generator 6 comprises transistors 34 and 35 whose respective emitters are connected to the inputs 101 and 100 and the respective collectors to the collectors of transistors 36 and 37. The emitters of the transistors 36 and 37 are connected to ground, their respective bases are connected to the inputs 93 and 94 and their respective collectors to the output 91 via resistors 38 and 39. Should the output voltage of the quadrature demodulator of the integrated circuit A at the terminals $A_5$ and $A_6$ exceed a certain threshold voltage then the stop-pulse generator 6 supplies a stop-pulse at its output 91. The low-pass filter 31-33 limits the number of false stop-pulses generated by audio signals.

The signals generating device 7 comprises a series arrangement of a thyristor 50 and a resistor 51, one end of which is connected to the terminal $B_{12}$ via a resistor 57, and other end being connected to ground. A capacitor 54 and a voltage divider 55, 56 are arranged in parallel with this series arrangement. A control electrode of the thyristor 50 is connected to ground via a capacitor 53 and to the output 91 of the stop-pulse generator 6. A further control electrode of the thyristor 50 is coupled to the resistor 57 via a resistor 52. By means of the junction between the resistors 55 and 56 the voltage divider 55, 56 is coupled to the terminal $B_1$ of the integrated circuit B via the output 92.

The thyristor 50 is brought to the conducting state by a stop-pulse at the output 91 of the stop-pulse generator 6 so that the capacitor 54 is discharged. In response thereto the voltage at the output 92 decreases and remains for a certain period of time, determined by the voltage $V_1$, the capacitor 54 and the resistor 57, below a certain switching voltage. The voltage $V_2$ is switched off during this period of time.

The tuning control panel 8 comprises touch controls 68 and 69 which are short-circuited when they are touched. They are coupled on the one hand to the outputs 8′ and 8″ via protection resistors 66 and 67, respectively, and on the other hand to the terminal $B_{14}$ (voltage $V_2$) via a resistor 71.

The controllable current source 9 comprises a transistor 78 whose emitter is connected to ground via a voltage divider 80, 81. The junction between the resistors 80 and 81 is connected to the output 99. The collector of the transistor 78 is coupled to the emitter of a transistor 79, this emitter being connected to ground via an emitter resistor 82. The collector of the transistor 79 is connected to the output 96. The base of the transistor 79 is connected to the first supply input 97 via a controllable resistor 84 and also to the second supply input 98 via a resistor 85 and to ground via a capacitor 86. When tuning is achieved, in the case of an active automatic frequency control, the current supplied to the terminal $B_{10}$ is equal to the current through the transistor 79 and the leakage current through the capacitor 90.

The external controllable tuned circuit 3 comprises a resonant circuit tuned to the intermediate frequency and consisting of two coupled coils 27 a first coil of which is arranged in parallel with a series arrangement of capacitors 25 and 26, a second coil being connected on the one hand via a coupling capacitor 29 to the terminal $A_1$ and on the other hand via a coupling capacitor 28 to the terminal $A_2$ of the integrated circuit A. The capacitor 25 is shunted by a resistor 22 and the capacitor 26 by a field effect transistor 21 (FET) in series with a resistor 23. The gate electrode of the field effect transistor 21 is connected on the one hand to the resistor 22, the capacitor 25 and the said first coil via a variable resistor 24 and on the other hand to the terminal $B_5$.

When a current is applied to the gate electrode of the field effect transistor 21 this transistor conducts and the capacitor 26 is shunted by the resistor 23 causing the quality of the resonant circuit to decrease. This is manifested by a slope of the S-curve of the quadrature demodulator of the integrated circuit A which is less steep then for the case the field effect transistor 21 does not conduct.

When the touch control 68 is touched a control current is applied to the terminal $B_{11}$ via the diode 74 causing the current at the terminal $B_5$ to be switched off. A first result is that the automatic frequency control current $I_{afc}$ at terminal $B_{10}$ is switched off, so that the automatic frequency control is rendered inoperative. A second result is that the base current of the transistor 79 decreases and, consequently, also its collector current. So, less current is withdrawn from the terminal $B_{10}$ by the transistor 79 so that the tuning capacitor 90 is supplied with more current. This causes the tuning voltage to increase and produces a variation in the tuning frequency. A third result is, that the field effect transistor 21 is cutoff, causing the slope of the above-mentioned S-curve to become steeper and the demodulation sensitivity of the quadrature demodulator to increase to a certain maximum level.

Touching the touch control 68 also results in that the resistor 39 of the stop pulse generator 6 is short-circuited by the transistor 37, so that no stop-pulses can be produced at the output 91.

When the touch control 69 is touched a control current is applied to the base of the transistor 78 via the input 95 of the controllable current source 9 which renders this transistor conductive, causing a control current to be supplied at the output 99, this current being applied to the terminal $B_{11}$ via the resistor 77 and the diode 75, with the above-mentioned results. As was the case when the touch control 68 was touched, the base voltage of the transistor 79 decreases now also owing to the fact that the current at the terminal $B_5$ is switched off. However, the decrease in the emitter voltage in response to the fact that the resistors 80 and 81 are arranged in parallel with the emitter resistor 82 is greater, all this resulting in the fact that a greater amount of current is withdrawn from the transistor 79 at the terminal $B_{10}$. As a consequence the current to the tuning capacitor 90 decreases and, therefore, also the tuning voltage. This causes the tuning frequency to change in a direction which is opposite to the direction in which the tuning frequency varies in response to touching of the touch control 68.

When now, in response to a continuous touching of one of the touch controls 68 and 69 the tuning frequencies varies over the tuning scale and a stop-pulse is generated, the voltage $V_2$ is switched off, as described above. The result thereof is that also the control current at the terminal $B_1$ is switched off. The automatic frequency control current $I_{afc}$ is switched on again so that the automatic frequency control is made operative. A current is again supplied at the terminal $B_5$ so that, firstly, the setting of the transistor 79 is restored to the state wherein the current applied to the tuning capacitor 90 is equally large as its leakage current and, secondly, the field effect transistor 21 starts conducting again, causing the slope of the S-curve of the quadrature demodulator to become less steep and the demodulation sensitivity to be brought to a certain minimum level.

After the above-mentioned period of time, which is determined in the control signal generating device 7, the voltage $V_2$ is restored and, when one of the touch controls 68 and 69 are touched again and/or is continuously touched, the above-described search tuning process is cycled through again until the output voltage of the quadrature demodulator at the terminals $A_5$ and $A_6$ again exceeds the threshold voltage of the stop-pulse generator 6 and a next stop-pulse is generated.

In a practical embodiment the resistance value of the resistors 22, 23 and 24 was 68 K$\Omega$, 100$\Omega$ and 1 M$\Omega$, respectively, the capacitance values of the capacitors 25, 26, 28 and 29 was 120 pF, 270 pF, 39 pF and 39 pF, respectively, and the field effect transistor was of the type BF 256 A. The above-mentioned first coil of the two coupled coils 27 had 11 turns and a value of 2.6 mH. The above-mentioned second coil had 3 turns. In the conducting state of the field effect transistor 21 the circuit quality of the tuned circuit 3 was 40, this circuit quality being 95 in the cutoff state of this field effect transistor 21. The circuit 3 was tuned to 10.7 MHz.

The values of the other elements correspond to the values indicated in the circuit diagram of FIG. 7 of the last-mentioned publication.

Figure 2:
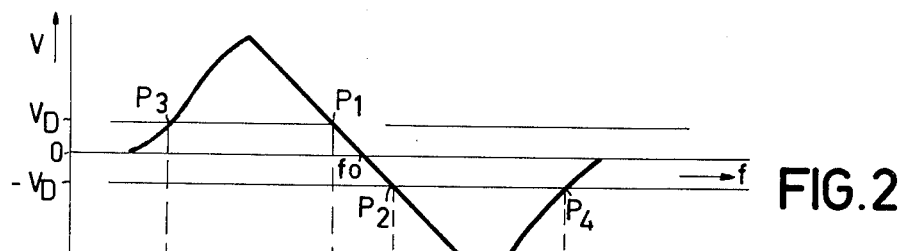
FIG. 2 shows the S-curve of the quadrature demodulator of the FM-receiver of the preceding Figure at a minimal demodulation sensitivity.

FIG. 2 shows the variation of the output voltage of the quadrature demodulator of the integrated circuit A at the terminals $A_5$ and $A_6$ at a minimal demodulation sensitivity, that is to say at a low quality of the tuned circuit 3, in a frequency range around a transmitter frequency $f_o$. The points $P_3$, $P_1$, $P_2$ and $P_4$ denote where the threshold voltage $V_D$ and $-V_D$, respectively, of the stop-pulse generator 6 are exceeded and, consequently, where stop-pulse edges occur.

Figure 2A:
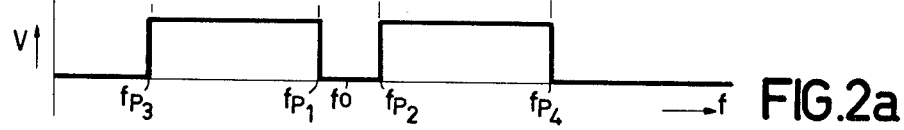
FIG. 2a shows a graph of stop pulses versus frequency over a demodulator S-curve range.

FIG. 2a shows the variation of the stop-pulses for continuous tuning over the frequency range of the S-curve of the preceding FIG. 2. The stop-pulse edges occur at the frequencies $f_{P3}$, $f_{P1}$, $f_{P2}$ and $f_{P4}$. The carrier frequency $f_o$ is located between the frequencies $f_{P1}$ and $f_{P2}$.

Figure 3:
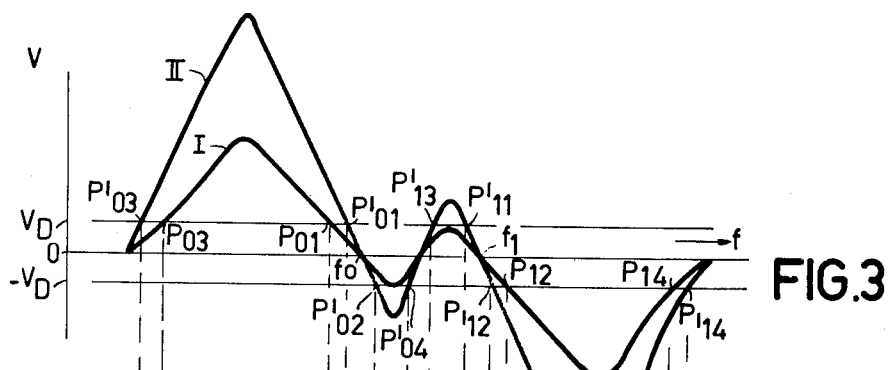
FIG. 3 shows the output voltage of said quadrature demodulator at a minimum and a maximum demodulation sensitivity at two adjacent transmitter frequencies as a function of the tuning frequency.

By means of graph I, FIG. 3 shows for the situation wherein two transmitters having transmitting frequencies $f_0$ and $f_1$ are closely adjacent, the variation of the output voltage at the terminals $A_5$ and $A_6$ at a minimal demodulation sensitivity, that is to say at a low quality of the tuned circuit 3, and by means of graph II the same variation at a maximum demodulation sensitivity, that is to say at a high quality of the tuned circuit 3.

The graph I intersect the threshold voltages $V_D$ and $-V_D$, respectively, of the stop-pulse generator 6 in the points $P_{03}$, $P_{01}$, $P_{12}$ and $P_{14}$, the graph II intersects the said threshold voltages $V_D$ and $-V_D$ in the points $P_{03}'$, $P_{01}'$, $P_{02}'$, $P_{04}'$, $P_{13}'$, $P_{11}'$, $P_{12}'$ and $P_{14}'$.

Figure 3A:
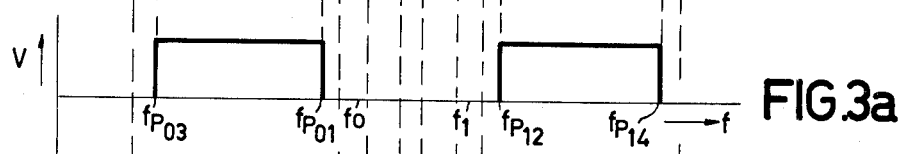
FIGS. 3a and 3b show graphs of stop pulses versus frequency for minimum and maximum demodulator sensitivity conditions, respectively.

FIG. 3a shows the variation of the stop-pulses at a minimum demodulation sensitivity (graph I FIG. 3) at a continuous tuning over the frequency range of the S-curves of the preceding FIG. 3.

The transmitting frequencies $f_0$ and $f_1$ are both located between the frequencies $f_{P01}$ and $f_{P12}$. In a search tuning process with an increasing tuning frequency f the automatic frequency control will key the tuning to the transmitting frequency $f_0$ after passing the frequency $f_{P01}$. Thus, a further tuning to the transmitting frequency $f_1$ is not possible. In a search tuning process with a decreasing tuning frequency $f_1$ the automatic frequency control will key the tuning to the transmitting frequency $f_1$ after passing the frequency $f_{P12}$. Thus, a further tuning to the transmitting frequency $f_0$ is not possible.

Figure 3B:
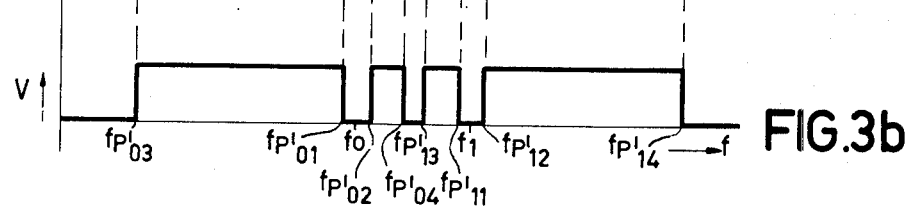

FIG. 3b shows the variation of the stop-pulses at a maximum demodulation sensitivity (graph II, FIG. 3) at a continuous tuning over the frequency range of the S-curves of FIG. 3. The transmitting frequency $f_0$ is then located between frequencies $f_{P01}$, and $f_{P02}$; the transmitting frequency $f_1$ between frequencies $f_{P11}$, and $f_{P12}'$. As now the transmitting frequency $f_0$ as well as the transmitting frequency $f_1$ are both flanked by individual stop-pulses a tuning to both transmitting frequencies $f_0$ and $f_1$ is possible, independent of the direction of the search tuning process.

Once tuning has been achieved the quality of the tuned circuit 3 is brought to a minimum level (graph I, FIG. 3), which prevents the generation of false stop-pulses by the exceeding of the threshold voltages $V_D$ and $-V_D$ by audio signals.

What is claimed is:

1. A FM-receiver comprising a search tuning arrangement, a control device for making the search tuning arrangement operative, a frequency discriminator and a stop-pulse generator having a threshold and being connected to an output of the frequency discriminator and supplying, when its threshold voltage is passed by the output voltage of the frequency discriminator a stop-pulse for making the search tuning arrangement inoperative, characterized in that the FM receiver also comprises a control circuit connected to the frequency discriminator and to the stop-pulse generator for increasing the ratio between the output voltage of the frequency discriminator and the threshold voltage of the stop-pulse generator upon activation of search tuning and for reducing this ratio when search tuning arrangement is made inoperative.

2. A FM receiver as claimed in claim 1, wherein the frequency discriminator comprising a resonant circuit, characterized in that the control circuit comprises a switchable circuit element coupled to said resonant circuit, for increasing the circuit quality of the resonant circuit during search tuning and for reducing said circuit quality when search tuning is made inoperative.

3. A FM receiver as claimed in claim 2, characterized in that the switchable circuit element of the control circuit is a resistor which is switchably connected in parallel across the resonant circuit.

* * * * *

UNITED STATES PATENT AND TRADEMARK OFFICE
CERTIFICATE OF CORRECTION

PATENT NO. : 4,253,195

DATED : February 24, 1981

INVENTOR(S) : ARNOLDUS GARSKAMP

It is certified that error appears in the above—identified patent and that said Letters Patent is hereby corrected as shown below:

| | | |
|---|---|---|
| Claim 1, Col. 8, line 23 | change "and" to --said stop-pulse generator being arranged for-- |
| line 32 | delete "ar-" |
| line 33 | delete "rangement" |
| Claim 2, Col. 8, line 35 | change "comprising" to --comprises-- |
| line 37 | change "to said" to --in the-- |

Signed and Sealed this

Third Day of August 1982

[SEAL]

Attest:

GERALD J. MOSSINGHOFF

*Attesting Officer*     *Commissioner of Patents and Trademarks*